United States Patent
Hsia et al.

[19]

[11] Patent Number: 6,043,547
[45] Date of Patent: *Mar. 28, 2000

[54] CIRCUIT STRUCTURE WITH AN ANTI-REFLECTIVE LAYER

[75] Inventors: Liang-Choo Hsia, Taipei; Thomas Chang, Hsinchu, both of Taiwan

[73] Assignee: Mosel Vitelic, Inc., Hsinchu, Taiwan

[*] Notice: This patent issued on a continued prosecution application filed under 37 CFR 1.53(d), and is subject to the twenty year patent term provisions of 35 U.S.C. 154(a)(2).

[21] Appl. No.: 08/870,896

[22] Filed: Jun. 6, 1997

Related U.S. Application Data

[62] Division of application No. 08/563,526, Nov. 28, 1995, Pat. No. 5,672,243.

[51] Int. Cl.[7] .................. H01L 31/0232; H01L 23/58; H01L 23/48; H01L 23/52
[52] U.S. Cl. ................. 257/437; 257/435; 257/629; 257/766; 438/72; 438/952
[58] Field of Search .................. 257/435, 437, 257/629, 766; 438/72, 952

[56] References Cited

U.S. PATENT DOCUMENTS

| | | | |
|---|---|---|---|
| 4,178,403 | 12/1979 | Sakurai et al. | 428/209 |
| 4,556,608 | 12/1985 | Kaneki et al. | 428/629 |
| 4,720,442 | 1/1988 | Shinkai et al. | 430/5 |
| 4,757,234 | 7/1988 | Ikuta et al. | 313/496 |
| 4,764,441 | 8/1988 | Ohta et al. | 430/5 |
| 4,820,611 | 4/1989 | Arnold, III et al. | 430/271 |
| 4,853,098 | 8/1989 | Drinkwine | 204/192.2 |
| 5,066,615 | 11/1991 | Brady et al. | 437/229 |
| 5,262,633 | 11/1993 | Kasai et al. | 250/208.1 |
| 5,286,608 | 2/1994 | Koh | 430/313 |
| 5,326,431 | 7/1994 | Kadomura | 49/629 |
| 5,378,659 | 1/1995 | Roman et al. | 437/229 |
| 5,459,002 | 10/1995 | Alpay et al. | 430/5 |
| 5,609,977 | 3/1997 | Iwamatsu et al. | 430/315 |

OTHER PUBLICATIONS

H.A.M. van den Berg and J.B. van Staden, Antireflectin Coatings on Metal Layers for Photolithographic Purposes, J.Appl.Phys. 50(3), 1212–1214, Mar. 1979.

*Primary Examiner*—Olik Chaudhuri
*Assistant Examiner*—Howard Weiss
*Attorney, Agent, or Firm*—Townsend and Townsend and Crew LLP

[57] ABSTRACT

An antireflection coating (116) for use in fabricating integrated circuits and electronic devices comprises a film of chromium oxide, CrO, or chromium suboxide, $CrO_x$ where $x<1$. An antireflection layer reduces the standing waves and topographic notching in a photoresist layer (118) when applied over a highly reflective layer (114). Highly reflective layers may be metals, such as aluminum or gold, silicides, or semiconductors, such as silicon. These coatings are preferably made by reactive sputtering of a chromium target with a partial pressure of oxygen in the sputtering chamber. The antireflection layer works primarily by absorptive, rather than wave matching, principles. This antireflection layer exhibits good adhesion and may be integrated into the device. Integrating the layer into the device may reduce stress in the underlying layers and improve device yields and reliability.

25 Claims, 3 Drawing Sheets

CIRCUIT STRUCTURE WITH AN ANTI-REFLECTIVE LAYER

This is a Division of application Ser. No. 08/563,526 filed Nov. 28, 1995 now U.S. Pat. No. 5,672,243, the disclosure of which is incorporated by reference.

BACKGROUND OF THE INVENTION

The present invention relates to semiconductor integrated circuit fabrication. More particularly, the present invention provides a technique, including a method and structure, for high resolution photolithography of reflective layers.

Photolithography is a common process used in the fabrication of integrated circuits or integrated circuit devices. These devices are made on a semiconductor wafer using various process steps. These process steps are performed on the wafer to form integrated circuit elements using, for example, patterns on thin layers, e.g., insulating material, metal, silicon, etc. Photolithography techniques create these patterns on the thin layers.

Generally, these photolithographic techniques are a sequential series of steps used to produce the patterns on the thin layers. These steps include applying a layer of photosensitive material, often termed photoresist, to the surface of the wafer, and exposing portions of the photoresist through a patterned mask or photomask. The photomask is typically a glass plate having a pattern, like a picture, on one side. The patterned side is placed next to, and sometimes on, the photoresist layer during exposure to insure the accurate transfer of the pattern from the mask to the photoresist layer.

A special lamp is used to expose the photoresist layer. Typically, this lamp produces light of a predominant single wavelength. The exposure is timed so that the desired amount of light shines on the photoresist. Too much or too little light can result in a poor exposure. The lamp is also designed to shine the light perpendicular to the mask to insure the accurate reproduction of the pattern on the mask to the photoresist. Any light incident to the photoresist layer at an angle can expose photoresist under the shadowed area of the patterned mask where exposure is undesirable.

After exposure, the photoresist is developed. Typically, the wafer is placed in a solvent bath, washing away the undesired photoresist. If the photoresist is a positive type, the photoresist that was under the shadowed areas of the mask remains, and the areas of resist that were exposed to the light wash away. This leaves a pattern in the photoresist that is similar to the pattern on the mask, in other words, a positive image of the mask pattern. If the photoresist is a negative type, the areas that were exposed to the light remain, and the areas that were shadowed wash away. This leaves a pattern of photoresist that is a negative of the pattern on the mask.

The pattern of photoresist can now be transferred to the underlying layer on the wafer by etching or other processes. For example, the wafer can be placed in a chemical bath that dissolves exposed portions of the layer where the layer is not protected by the photoresist. The goal is to obtain a pattern on the wafer that is as faithful as possible to the pattern on the mask.

It is often difficult to obtain a faithful pattern on highly reflective layers because the amount of light that the layer reflects can partially expose some of the photoresist. Highly reflective layers include layers of metals, such as aluminum or gold, semiconductors, such as silicon, or silicides, which are alloys of silicon and metal. This problem becomes more significant as the patterns become finer because the amount of reflected light has a greater relative effect on exposing a thin line, which casts a narrow shadow, than a thick line, which casts a wide shadow. An antireflection coating on top of a highly reflective layer can improve the resolution of the photoresist pattern and the subsequent precision of the pattern in the reflective layer.

Various methods have been proposed to produce an antireflection coating on a reflective surface in order to improve photolithographic processing. The use of a polyimide layer with a light absorbing dye is known. This method, however, requires several critical process steps which are difficult to control. Additionally, the polyimide coating must be thin in order to preserve the precision of the exposed pattern. However, a thinner layer absorbs less light. Hence, the polyimide layer thickness is generally a compromise between good light absorption and good pattern definition. This polyimide layer is also typically removed before more wafer processing occurs.

Another approach is to use a coating of titanium compounds, such as titanium nitride (TiN) or titanium dioxide ($TiO_2$) on top of a metal layer to suppress standing waves. These approaches rely on precisely matching the thickness of the coating to the wavelength of light used in the exposure of the photoresist. Not only is the precise control of the deposition of the dielectric layer difficult, producing such an antireflection layer must intend exposure of the photoresist with a particular wavelength of light. Substrates coated to be used with one light source will perform poorly if exposed with another.

An additional problem with this method is that it works best with materials where the imaginary part of the complex refractive index is small, but not zero, compared to the real part of the complex refractive index. See, e.g. H. A. M. van den Berg and J. B. van Staden, Antireflection Coatings on Metal Layers for Photolithographic Purposes, *J. Appl. Phys.*, 50 Mar. 3, 1979. This requirement narrows the list of desirable materials. While chromic oxide, $Cr_2O_3$, has been used as an antireflection on some "darker" reflectors, such as Cr, Fe, and Ni (producing a standing wave ratio of about 0.4), it is not optimal, especially on "brighter" reflectors, such as Al (producing a standing wave ratio of almost 0.9). This is partly because $Cr_2O_3$ has an imaginary refractive index equal to zero.

An alternative material and technique for producing an antireflective layer that did not depend on precisely matching the layer thickness to the exposure light wavelength would be a useful improvement. It would be further desirable if the improved technique for photolithography were easy to apply and produced fine lines.

SUMMARY OF THE INVENTION

The present invention provides an improved method for producing integrated circuit structures by providing an adsorptive antireflection coating between a reflective surface and a photoresist layer. The antireflection coating is achieved by forming a layer of chromium oxide (CrO) and/or chromium suboxide ($CrO_x$ where $0<x<1$) on top of a reflective layer, such as aluminum or silicide. The present invention is less sensitive to variations in the thickness of the antireflective layer than quarter-wave layers of dielectric materials. The present invention does not need to be removed from the semiconductor device after photolithography. Incorporating the $CrO_x$ layer into the device structure relieves stresses in the underlying metal or silicide layers. Additionally, because the $CrO_x$ layer may remain on the device, the process steps required to remove an organic anti-reflective layer are not required for the present invention.

According to one aspect of the invention, the antireflection layer is formed by reactively sputtering chromium or chromium alloy in an argon atmosphere with a partial back pressure of oxygen. Forming the chromium oxide layer by reactive sputtering allows the stoichiometric composition of the layer to be varied. The absorption of light by the $CrO_x$ layer varies with the stoichiometric composition of the $CrO_x$ layer, and hence the reflectivity from the reflective layer into the photoresist layer may be tuned.

A further understanding of the nature and advantages of the invention may be realized by reference to the remaining portions of the specification and the drawings.

DESCRIPTION OF THE SPECIFIC EMBODIMENT

Figure 1A:
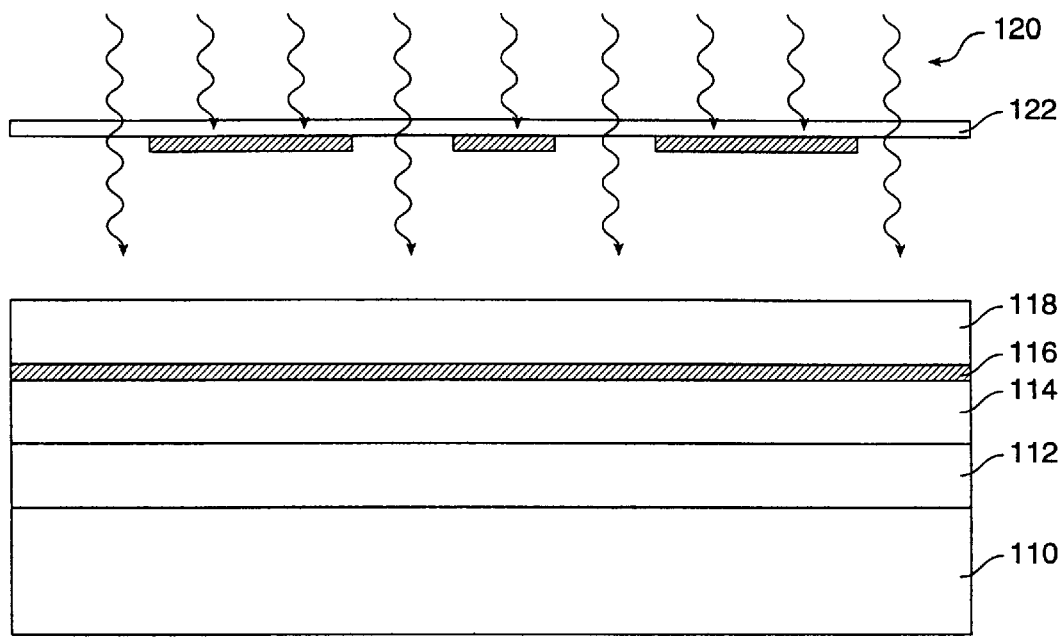
FIGS. 1A through 1C are schematic illustrations of one embodiment of this invention where the antireflection coating is between a reflective layer and a layer of photoresist.

FIG. 1A is a cross-sectional view of one embodiment of the invention. FIG. 1A shows a substrate 110 with a dielectric layer 112 over it. The substrate may be semiconductor, ceramic or other material but is preferably silicon. Of course, other substrates also can be used depending upon the application.

The dielectric layer can be any suitable insulating material, e.g., silicon dioxide, silicon nitride, etc. The insulating layer is formed by techniques such as chemical vapor deposition (CVD), thermal field growth, sputtering, or other well-known methods. Preferably, the dielectric layer is silicon dioxide.

A metal/silicide layer 114 is formed over the dielectric layer. The metal/silicide layer may be metal, such as aluminum, aluminum-copper alloy, or other aluminum alloys, or gold. Such layers have reflectivities in the range of 60% reflectivity to 90% reflectivity, the most important instance being 80% reflectivity. A layer of metal may be formed by evaporative, sputtering or CVD methods. Of course, the type of metal used depends upon the application.

Alternatively, the metal/silicide layer may be a silicide, which is a metal-silicon alloy. Such layers have reflectivities in the range of 50% reflectivity to 70% reflectivity, the most important instance being 60% reflectivity. In the preferred embodiment, layer 114 is a silicide layer where the metal component of the silicide is a refractory or noble metal such as cobalt, hafnium, niobium, nickel, palladium, platinum, tantalum, titanium, tungsten or zirconium. The preferred metal for alloying to form a silicide layer is titanium. An advantage of a silicide layer over a metal layer is that the silicide layer typically withstands higher subsequent processing temperatures, up to 950° C., without damage than a metal layer. Wafers containing aluminum layers, for example, are usually kept under 400° C. A silicide layer also typically has lower sheet resistivity than a polysilicon layer, which others in the art have used as an alternative to a metal layer.

In one embodiment, the silicide layer may be formed by co-evaporation, co-sputtering or sputtering of a composite sputtering target. The preferred technique for forming the silicide layer is sputtering of a composite sputtering target. Co-evaporation and co-sputtering relate to processes where both components of the desired alloy are evaporated or sputtered simultaneously from separate sources. Sputtering from a composite target involves a single sputtering target which contains both components, the silicon and an appropriate metal, of the desired silicide.

Another method of forming the silicide layer would be to deposit silicon, for example polysilicon, onto the dielectric layer, and then to deposit the desired alloying metal, for example one of the refractory or noble metals listed above, preferably titanium, onto the deposited silicon. A subsequent sintering step combines the deposited silicon and metal to form the silicide alloy. Sintering involves heating the substrate to a sufficient temperature that a substantially solid-state reaction occurs which forms the silicide layer from the deposited silicon and the deposited metal. The sintering process often leaves residual stress due to shrinkage of the silicide layer, which can affect the adherence of the metal/silicide layer to the underlying dielectric layer.

After the metal or silicide layer is formed, a chromium oxide layer 116 is then formed over the metal/silicide layer. The meaning of chromium oxide in this instance includes stoichiometric CrO and also sub-oxides, $CrO_x$, where "x" is less than one and greater than zero. It should be noted that chromium oxide is a distinctly different compound from chromic oxide, $Cr_2O_3$. The latter is the more typical oxide of chromium, where the chromium ion assumes a +3 valance. The chromium ion in CrO is typically reduced to +2 valence, however, chromium is multivalent from −2 to at least +6. Therefore, any individual chromium ion in the $CrO_x$ film may not have a +2 valence. Typically, the chromium oxide layer has, on the average, less than one oxygen atom per chromium atom with the chromium ion in a +2 valence state. Hereafter, $CrO_x$ will be used, as a convenience, to represent both chromium oxide and chromium suboxide.

In the preferred embodiment the $CrO_x$ layer is formed by reactive sputtering from a chromium target using argon as the primary sputtering gas, with a partial pressure of an oxygen containing gas, such as $O_2$. The preferred pressure of argon is 3 mTorr. The preferred target is chromium. The sputtering rate ranges from 10 Å/sec to 20 Å/sec, with a preferred rate being 15 Å/sec. Oxygen in the sputtering gas reacts with the sputtered chromium to form chromium oxide on the surface of the metal/silicide layer. In such a system, the oxygen flow rate is preferably 40 sccm, but may range, depending on conditions, from 30 sccm to 50 sccm. The argon flow rate is preferably 20 sccm. The $CrO_x$ layer thickness may range from 100 Å to 500 Å, with the preferred thickness being 300 Å. The stoichiometry of the deposited chromium oxide layer may be controlled by varying the amount of oxygen, representing the partial pressure, admitted into the sputtering chamber during the sputtering process. The ratio of Cr:O may range from 1:1 to 1:0.25, with the preferred ratio being 1:0.85.

The light absorption properties of the $CrO_x$ layer depends upon the stoichiometric ratio of Cr to O in the layer and varies from 40% absorption to 92% absorption representing Cr:O ratios from 4:1 to 4:3, for a $CrO_x$ layer 300 Å thick. Thus, the absorption characteristics of the $CrO_x$ layer may be tuned by varying the amount of oxygen containing gas admitted into the sputtering chamber during the sputtering process.

The purpose of the chromium oxide layer is to reduce the reflectivity from the surface of the metal/silicide layer. This reduces the optical standing waves and topographic notching in the photoresist layer 118 when light 120 originating from an exposure source (not shown) passes through the photomask 122 and reflects back off of the metal/silicide layer. Interposing a $CrO_x$ antireflective layer, as described above, between the highly reflective layer and the photoresist layer may reduce the standing waves by 50%. While a feature of this invention is that it works well with exposure wavelengths from 1900 Å to 5000 Å, the preferred exposure wavelength is 3650 Å.

The $CrO_x$ layer reduces the amount of light reflected from the metal/silicide layer back into the photoresist layer in at least three ways. First, the $CrO_x$ layer absorbs some of the light travelling from the exposure source to the metal/silicide layer. This reduces the amount of light reaching the metal/silicide layer that could be reflected back. Second, the reflected light must pass through the $CrO_x$ layer on its way back into the photoresist. This reduces the amount of light reflected off of the metal/silicide layer. Third, because the refractive index of the $CrO_x$ layer may vary from $3.47–j3.83$ to $1.39–j0.88$, as opposed to the refractive index of the photoresist layer, which is typically $1.65–j0.02$, some light is reflected from the $CrO_x$-photoresist interface. This further reduces the amount of light reaching and reflecting off of the metal/silicide layer. By reducing the light reflected from the surface of the metal/silicide layer, optical standing waves and topographic notching in the photoresist layer are reduced.

Figure 1B:
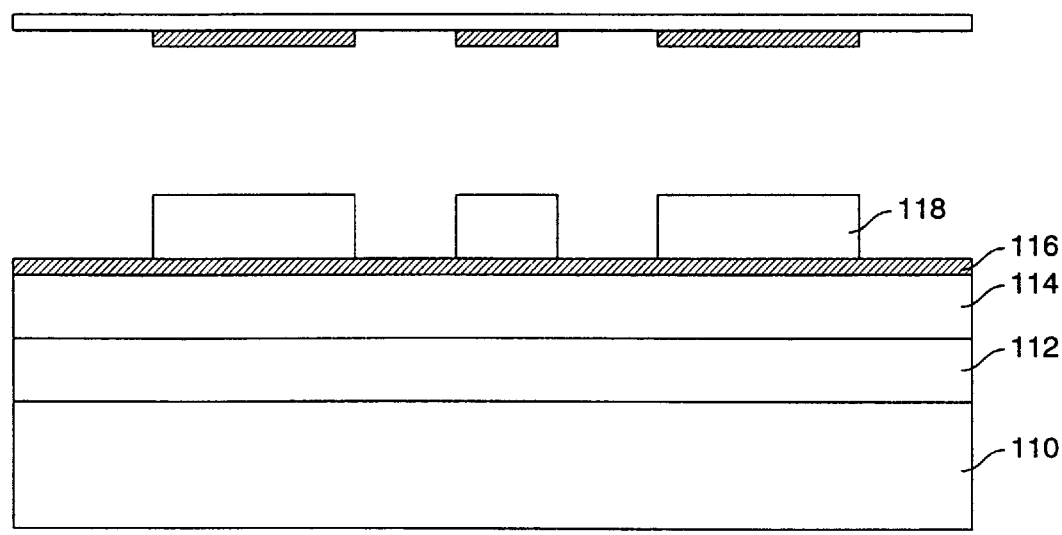

The photoresist may be a positive photoresist or a negative photoresist. The preferred type of photoresist is DNQ/Novolac type. FIG. 1B depicts a developed positive photoresist layer on the antireflective coating layer. Standard processes may be used to develop the photoresist. Developing creates a pattern in the photoresist layer according to the pattern on the photomask.

Figure 1C:
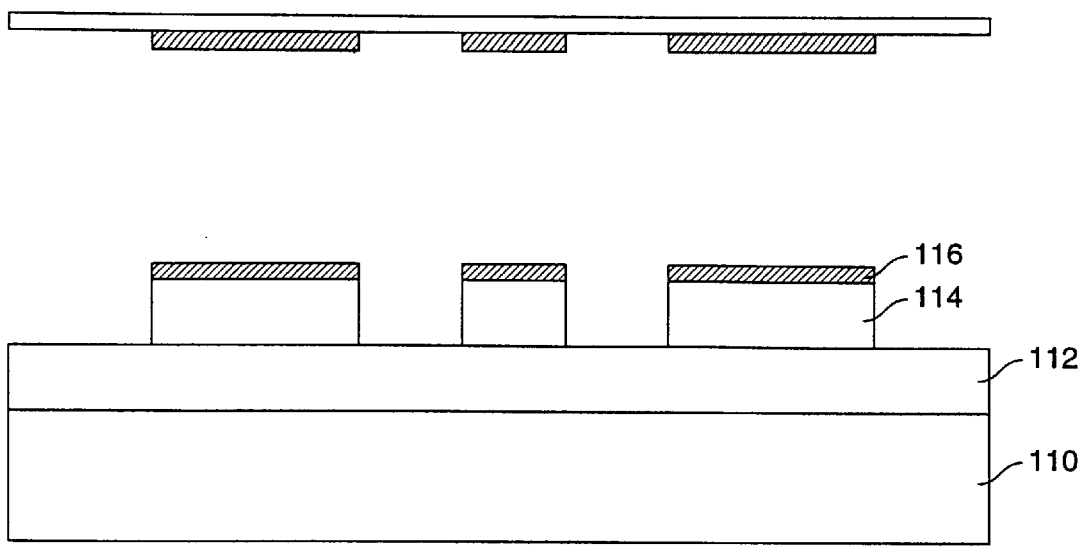

FIG. 1C depicts the integrated circuit structure after further processing known to those skilled in the art. This further processing etches the $CrO_x$ and metal/silicide layers according to the pattern created in the photoresist layer. Subsequent processing removed the photoresist layer from the integrated circuit structure. Of particular note is that the $CrO_x$ layer remains on the patterned metal/silicide layer.

Silicide and polycide layers often shrink after formation or sintering. This shrinkage results in high residual stresses in the silicide or polycide layer. Because of these stresses, cracks in the layer may form, or the layer may detach from the underlying dielectric layer. Integrating the $CrO_x$ layer into the circuit structure reduces residual stresses in the silicide or polycide layer and enhances both the circuit reliability and yield.

Figure 2A:
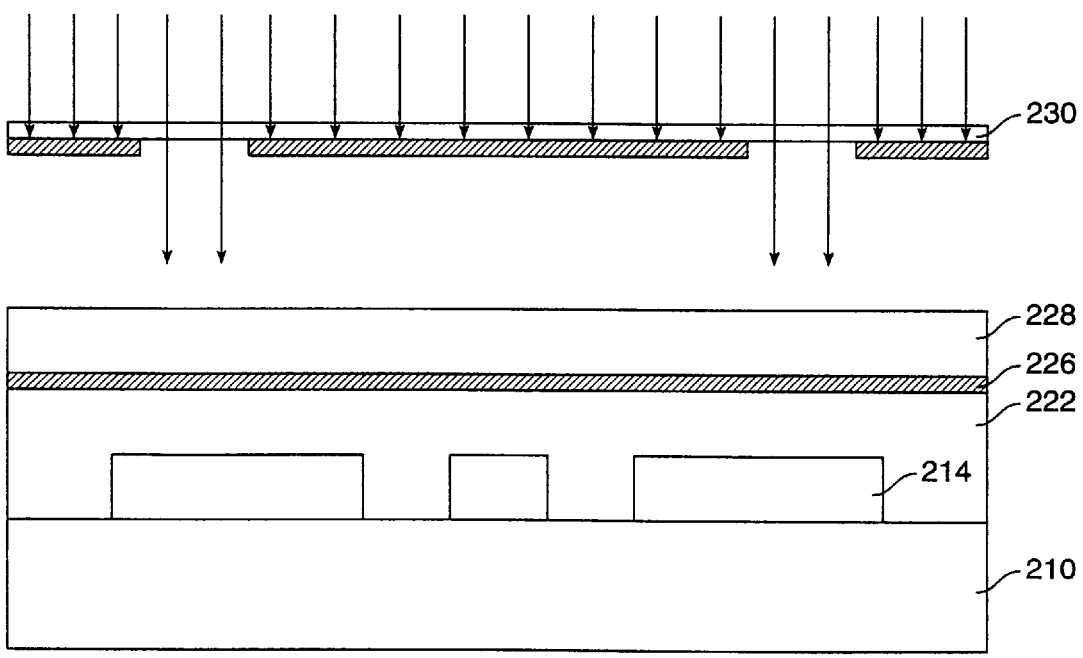
FIGS. 2A through 2C are schematic illustrations of one embodiment of this invention where the antireflection coating is between a dielectric layer on top of a patterned reflective layer and a layer of photoresist.

FIG. 2A is a simplified cross-sectional view of another embodiment of the $CrO_x$ antireflection coating. In this embodiment, a patterned metal/silicide layer 214 has been formed on a semiconductor substrate 210, preferably silicon. Although FIG. 2A depicts a patterned metal/silicide layer, those skilled in the art will appreciate that the metal/silicide layer could also be unpatterned, that is, it could completely cover the substrate. A layer of dielectric 222, such as $SiO_2$ covers the metal/silicide layer and substrate. This layer of $SiO_2$ may be from 2,000 Å to 3,000 Å thick. An antireflective $CrO_x$ layer 226 is formed on top of the dielectric layer, as discussed above. The preferred thickness of this $CrO_x$ layer is 300 Å and the preferred stoichiometric ratio of Cr:O is 4:3. A layer of photoresist 228 is formed on top of the $CrO_x$ layer.

Figure 2B:
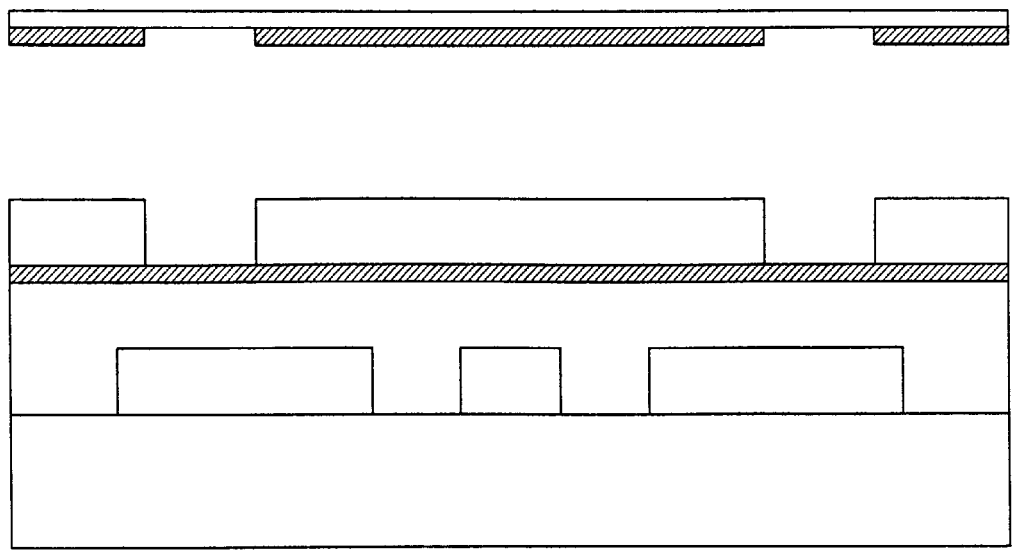
Figure 2C:
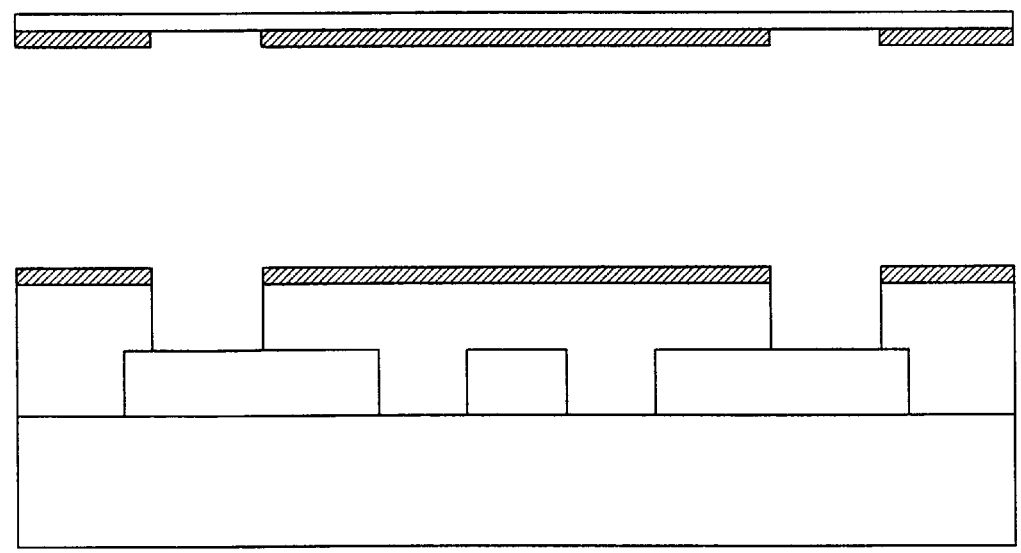

Light from an exposure source (not shown) is passed through a photomask 230 to expose the photoresist layer. FIG. 2B is a simplified cross-sectional view of the structure after the photoresist layer has been developed by standard processes. FIG. 2C is a simplified cross-sectional view of the structure after the $CrO_x$ and dielectric layers have been formed according to standard photolithographic processes. The good adhesion properties of the $CrO_x$ layer to the $SiO_2$ layer allow its incorporation into the integrated circuit structure.

$CrO_x$ is an improved antireflective coating over prior art antireflective coatings. The absorptive nature of the coating produces an antireflective coating whose effectiveness is less sensitive to coating thickness or the wavelength of light from the exposure source than some prior art coatings. Additionally, prior art coatings are difficult to integrate into the device structure. Removing these coatings requires additional process steps. $CrO_x$ antireflective coatings may be integrated into the device structure. This reduces process steps. Additionally, the $CrO_x$ layer may act to relieve stress in the underlying layer, improving reliability and yield.

While the above is a full description of the specific embodiments, various modifications, alternative constructions, and equivalents may be used. For example, while the description above is in terms of using a positive photoresist, a negative photoresist may be used. Likewise, while the description above relates to a reflective layer on a semiconductor circuit, a similar benefit would accrue if the antireflective coating were used to create a thin film circuit on sapphire, for instance.

Therefore, the above description and illustrations should not be taken as limiting the scope of the present invention, which is defined by the appended claims.

What is claimed is:

1. A circuit structure on a substrate comprising:
   a reflective layer, said reflective layer being electrically conductive and having a reflectivity of between about 50% and about 90%; and
   a layer of chromium oxide/suboxide disposed on said reflective layer, wherein said chromium oxide/suboxide layer consists essentially of chromium and oxygen in a stoichiometric ratio between about 1:1 and about 4:1 Cr:O;
   wherein said chromium oxide/suboxide layer is substantially free of nitrogen.

2. The structure of claim 1 wherein said reflective layer comprises silicide or polycide.

3. The structure of claim 1 wherein said reflective layer comprises aluminum.

4. A circuit structure comprising:
   a silicon wafer;
   a reflective layer disposed on said silicon wafer, said reflective layer being electrically conductive and having a reflectivity of between about 50% and about 90%;
   a dielectric layer disposed over said reflective layer; and
   a layer of chromium oxide/suboxide disposed on said dielectric layer, wherein said chromium oxide/suboxide layer consists essentially of chromium and oxygen in a stoichiometric ratio of between about 1:1 and about 4:1 Cr:O, wherein said chromium oxide/suboxide layer is substantially free of nitrogen.

5. The structure of claim 4 wherein said reflective layer comprises aluminum.

6. The structure of claim 4 wherein said reflective layer comprises silicide.

7. The structure of claim 4 wherein said reflective layer comprises polycide.

8. The structure of claim 1 wherein said layer of chromium oxide/suboxide has a thickness of between about 100 Å and about 500 Å.

9. The structure of claim 1 wherein said layer of chromium oxide/suboxide has a stoichiometric ratio of chromium to oxygen of between about 4:1 and about 4:3 Cr:O.

10. The structure of claim 1 wherein said layer of chromium oxide/suboxide absorbs between about 40% and about 92% of light having a wavelength of between about 1,900 Å and about 5,000 Å incident upon said layer.

11. The structure of claim 2 wherein said reflective layer has tensile stress, said tensile stress in said reflective layer being at least partially compensated by compressive stress in said layer of chromium oxide/suboxide.

12. The structure of claim 1 wherein said reflective layer is patterned.

13. The structure of claim 4 wherein said layer of chromium oxide/suboxide has a thickness of between about 100 Å and about 500 Å.

14. The structure of claim 4 wherein said layer of chromium oxide/suboxide has a stoichiometric ratio of chromium to oxygen of between about 4:1 and about 4:3 Cr:O.

15. The structure of claim 4 wherein said layer of chromium oxide/suboxide absorbs between about 40% and about 92% of light having a wavelength of between about 1,900 Å and about 5,000 Å incident upon said layer.

16. The structure of claim 4 wherein said dielectric layer comprises silicon dioxide.

17. The structure of claim 4 wherein said dielectric layer is between about 2,000 Å and 3,000 Å thick.

18. The structure of claim 4 wherein said reflective layer is patterned.

19. The structure of claim 4 wherein said dielectric layer is patterned.

20. A device comprising:
    a substrate;
    a highly reflective layer disposed on the substrate; and
    a layer of chromium oxide/suboxide that is substantially free of nitrogen disposed on the highly reflective layer.

21. An electronic semiconductor device structure comprising:
    a silicon wafer;
    a layer of a conductive material disposed on the silicon wafer, the conductive material selected from the group consisting of aluminum, aluminum-copper alloy, silicide, and polycide; and
    a layer of chromium-suboxide disposed on the layer of the conductive material, the layer of chromium-suboxide consisting essentially of chromium and oxygen in a ratio of between 1:1 and 4:1 Cr:O, said chromium-suboxide layer having an imaginary refractive index that is at least about 1.0 and being substantially free of nitrogen.

22. A circuit structure on a substrate comprising:
    a reflective layer, said reflective layer being electrically conductive and having a reflectivity of between about 50% and about 90%; and
    a layer of chromium oxide/suboxide disposed on said reflective layer, wherein said chromium oxide/suboxide layer consists essentially of chromium and oxygen in a stoichiometric ratio between about 1:1 and about 4:1 Cr:O;
    said chromium oxide/suboxide layer having an imaginary refractive index that is at least about 1.0, and wherein said chromium oxide/suboxide layer is substantially free of nitrogen.

23. A circuit structure on a substrate, said structure comprising:
    a highly reflective layer disposed on the substrate;
    a layer of chromium oxide/suboxide disposed on the reflective layer, said chromium oxide/suboxide layer comprising chromium and oxygen in a ratio of between 1:1 and 4:1 Cr:O; and
    said chromium oxide/suboxide layer being substantially free of nitrogen and being adapted to have a circuit layer disposed thereon.

24. The structure as in claim 23, wherein said circuit layer comprises a dielectric layer.

25. The structure as in claim 23, wherein said circuit layer comprises a conductive layer.

* * * * *